(12) United States Patent
Lin et al.

(10) Patent No.: US 10,741,393 B2
(45) Date of Patent: *Aug. 11, 2020

(54) METHODS FOR BOTTOM UP FIN STRUCTURE FORMATION

(71) Applicant: Applied Materials, Inc., Santa Clara, CA (US)

(72) Inventors: Yung-chen Lin, Los Angeles, CA (US); Qingjun Zhou, San Jose, CA (US); Xinyu Bao, Fremont, CA (US); Ying Zhang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/259,585

(22) Filed: Jan. 28, 2019

(65) Prior Publication Data

US 2019/0252187 A1   Aug. 15, 2019

Related U.S. Application Data

(63) Continuation of application No. 15/896,839, filed on Feb. 14, 2018, now Pat. No. 10,204,781.

(51) Int. Cl.
| | |
|---|---|
| *H01L 21/033* | (2006.01) |
| *H01L 21/8234* | (2006.01) |
| *H01L 21/308* | (2006.01) |
| *H01L 29/66* | (2006.01) |
| *H01L 21/02* | (2006.01) |

(52) U.S. Cl.
CPC ...... *H01L 21/0337* (2013.01); *H01L 21/0332* (2013.01); *H01L 21/3086* (2013.01); *H01L 21/823431* (2013.01); *H01L 29/66795* (2013.01); *H01L 21/0262* (2013.01); *H01L 21/02532* (2013.01)

(58) Field of Classification Search
None
See application file for complete search history.

(56) References Cited

U.S. PATENT DOCUMENTS

| | | |
|---|---|---|
| 6,855,582 B1 | 2/2005 | Dakshina-Murthy et al. |
| 6,864,164 B1 | 3/2005 | Dakshina-Murthy et al. |
| 7,470,570 B2 | 12/2008 | Beintner et al. |
| 7,772,048 B2 | 8/2010 | Jones et al. |
| 9,209,279 B1 | 12/2015 | Zhang et al. |
| 9,412,603 B2 | 8/2016 | Zhang et al. |

(Continued)

OTHER PUBLICATIONS

Extended European Search Report for for European Application No. 19156890.6 dated Nov. 14, 2019.

*Primary Examiner* — Thien F Tran

(74) *Attorney, Agent, or Firm* — Patterson + Sheridan LLP

(57) ABSTRACT

Embodiments described herein relate to substrate processing methods. The methods include forming a patterned hardmask material on a substrate, forming first mandrel structures on exposed regions of the substrate, and depositing a gap fill material on the substrate over the hardmask material and the first mandrel structures. The first mandrel structures are removed to expose second regions of the substrate and form second mandrel structures comprising the hardmask material and the gap fill material. Fin structures are deposited on the substrate using the second mandrel structures as a mask.

19 Claims, 5 Drawing Sheets

(56) References Cited

U.S. PATENT DOCUMENTS

| | | |
|---|---|---|
| 9,530,637 B2 | 12/2016 | Zhang et al. |
| 10,096,524 B1 * | 10/2018 | Bi .................... H01L 21/823807 |
| 10,204,781 B1 * | 2/2019 | Lin ..................... H01L 21/0337 |
| 2001/0031559 A1 | 10/2001 | Koido et al. |
| 2005/0121412 A1 | 6/2005 | Beintner et al. |
| 2012/0228702 A1 | 9/2012 | Wu |
| 2012/0313170 A1 | 12/2012 | Chang et al. |
| 2013/0196508 A1 | 8/2013 | LiCausi |
| 2014/0213033 A1 | 7/2014 | Brunco et al. |
| 2015/0014807 A1 * | 1/2015 | Chuang ............. H01L 21/76224 |
| | | 257/506 |
| 2015/0041867 A1 | 2/2015 | Han |
| 2015/0091099 A1 | 4/2015 | Ching et al. |
| 2015/0126008 A1 | 5/2015 | Paul et al. |
| 2015/0145008 A1 | 5/2015 | Cheng et al. |
| 2015/0187909 A1 * | 7/2015 | Yan ................... H01L 29/42392 |
| | | 438/424 |
| 2015/0303274 A1 | 10/2015 | Zhu et al. |
| 2016/0013273 A1 | 1/2016 | Zhang et al. |
| 2016/0133692 A1 | 5/2016 | Morin et al. |
| 2017/0110364 A1 | 4/2017 | Song et al. |

\* cited by examiner

METHODS FOR BOTTOM UP FIN STRUCTURE FORMATION

CROSS-REFERENCE TO RELATED APPLICATIONS

This application is a continuation of and claims benefit to U.S. patent application Ser. No. 15/896,839, filed Feb. 14, 2018, the entirety of which is herein incorporated by reference.

BACKGROUND

Field

Embodiments of the present disclosure generally relate to methods for bottom up fin structure formation.

Description of the Related Art

Fin field effect transistors (FinFETs) are structures commonly utilized in the fabrication of semiconductor devices. Conventional FinFETs at current technology nodes are fabricated with conventional etching techniques. However, at advanced technology nodes with reduced critical dimensions and increasing aspect ratios, conventional etching techniques are inadequate to fabricate defect free FinFET devices.

For example, in order to fabricate FinFET devices with sufficient verticality for utilization in various semiconductor devices, thick spacers are utilized to pattern an underlying hardmask. The thick spacer height is utilized to reduce bending or leaning of the patterned spacer. However, when the spacer pattern is transferred to the hardmask, less than desirable verticality of the hardmask may persist which results in FinFET devices with slanted sidewalls or occluded trenches between adjacent FinFET structures.

Thus, what is needed in the art are improved methods for fin structure formation.

SUMMARY

In one embodiment, a substrate processing method is provided. The method includes forming a patterned hardmask material on a substrate, forming first mandrel structures on exposed regions of the substrate, and depositing gap fill material on the hardmask material and the first mandrel structures. The method also includes removing the first mandrel structure to expose second regions of the substrate and form second mandrel structures comprising the hardmask material and the gap fill material and forming fin structures on the second regions of the substrate using the second mandrel structures as a mask.

In another embodiment, a substrate processing method is provided. The method includes forming a hardmask material on a substrate, depositing a spacer material on the hardmask material, patterning the spacer material, and transferring the pattern of the spacer material to the hardmask material by etching the hardmask material to expose regions of the substrate. First mandrel structures are formed on the exposed regions of the substrate. A gap fill material is deposited on the hardmask material and the first mandrel structures. The first mandrel structures are removed to expose second regions of the substrate and form second mandrel structures comprising the hardmask material and the gap fill material. Fin structures are formed on the second regions of the substrate using the second mandrel structures as a mask, and recessing the gap fill material below a top surface of the fin structures.

In yet another embodiment, a substrate processing method is provided. The method includes forming a patterned hardmask material on a substrate and forming III-V material first mandrel structures on exposed region of the substrate. The III-V material first mandrel structures extend a first distance of greater than about 80 nm above a top surface of the substrate. A flowable oxide gap fill material is deposited on the hardmask material and the III-V material first mandrel structures. The III-V material first mandrel structure are removed to expose second regions of the substrate and form second mandrel structures comprising the hardmask material and the flowable oxide gap fill material. The second mandrel structures extend a second distance above the top surface of the substrate that is approximately equal to the first distance. Fin structures are epitaxially deposited on the second regions of the substrate and the gap fill material is etched after forming the fin structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to substrate processing methods that advantageously form fin structures form the bottom up. The methods include forming a patterned hardmask material on a substrate, forming first mandrel structures on exposed regions of the substrate, and depositing a gap fill material on the substrate over the hardmask material and the first mandrel structures. The first mandrel structures are removed to expose second regions of the substrate and form second mandrel structures comprising the hardmask material and the gap fill material. Fin structures are deposited on the substrate using the second mandrel structures as a mask.

Figure 8:
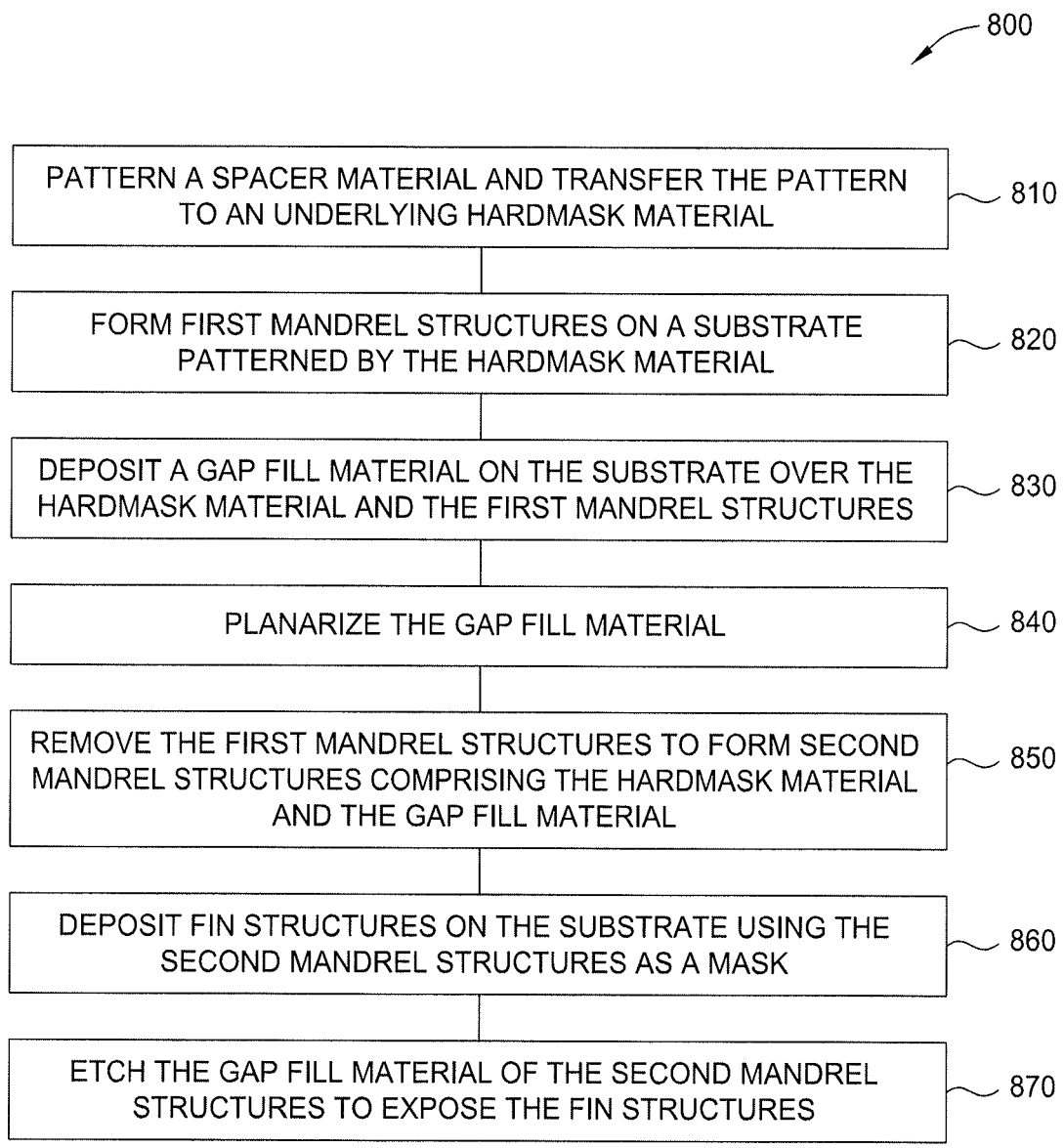
FIG. 8 illustrates operations of a method for patterning and etching a substrate according to an embodiment described herein.

FIG. 8 illustrates a flow diagram of a method 800 for bottom up patterning and etching a substrate according to an embodiment described herein. The method 800 is discussed concurrently with the illustrations depicted in FIGS. 1-6. At operation 810, a spacer material is patterned and the pattern is transferred to an underlying hardmask material.

Figure 1:
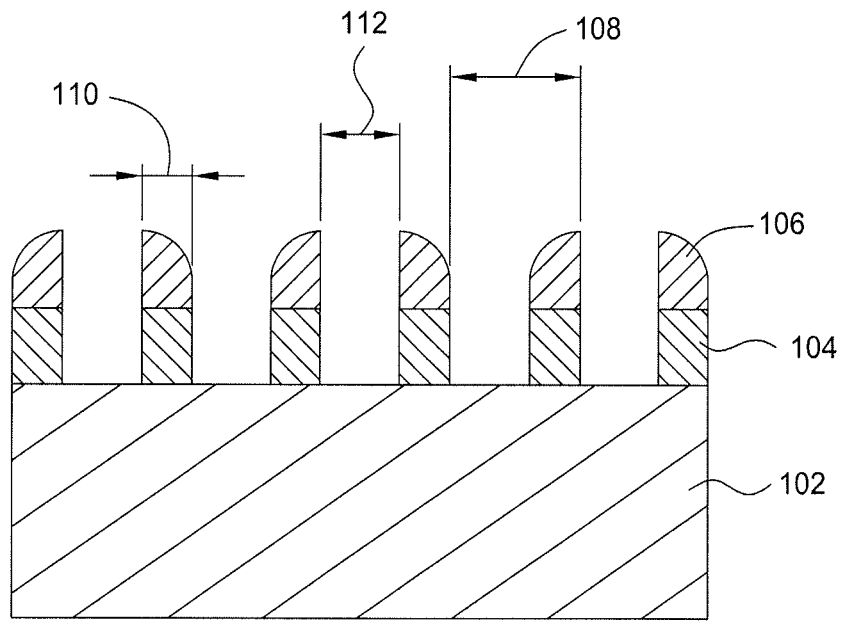
FIG. 1 illustrates a partial cross-sectional view of a substrate having a patterned spacer material and hardmask material formed thereon according to an embodiment described herein.

FIG. 1 illustrates a partial cross-sectional view of a substrate 102 having a patterned spacer material 106 and a hardmask material 104 formed thereon according to an embodiment described herein. In one embodiment, the substrate 102 is fabricated from a semiconducting material, such as silicon. For example, the substrate 102 is a monocrystalline silicon material which is either an intrinsic (un-doped) silicon material or an extrinsic (doped) silicon material. If an extrinsic silicon material is utilized, the dopant may be a p-type dopant, such as boron. In another embodiment, the substrate 102 is a silicon-on-insulator substrate.

As illustrated in FIG. 1, the spacer material 106 and the hardmask material 104 are patterned. Prior to patterning, the hardmask material 104 is deposited on and in contact with the substrate 102 in a blanket type layer. The spacer material 106 is then deposited on and in contact with the hardmask material 104. Patterning of the spacer material 106 is performed by various processes suitable for advanced technology nodes, such as the 10 nm node, the 7 nm node, the 5 nm node, and beyond. Examples of suitable patterning processes include self-aligned double patterning and self-aligned quadruple patterning which are, depending upon the desired implementation, immersion lithography or extreme ultraviolet (EUV) lithography processes. Other suitable patterning processes include directed self-assembly, 193 nm immersion litho-etch-litho-etch (LELE), and EUV LELE, among others.

The patterned spacer material 106 creates a mask for subsequent etching of the underlying hardmask material 104. In one embodiment, the spacer material 106 is a silicon oxide material, a silicon nitride material, or a titanium oxide material. In one embodiment, a thickness of the patterned spacer material 106 is approximately equal to one half of the fin pitch. For example, the thickness of the patterned spacer material is between about 15 nm and about 20 nm. In one embodiment, a thickness of the hardmask material 104 is between about 30 nm and about 50 nm, such as about 40 nm. The hardmask material 104 is fabricated from a silicon oxide material in one embodiment and a silicon nitride material in another embodiment.

An etching process, such as a wet etching process or dry etching process, is utilized to etch the hardmask material 104, thus transferring the pattern from the spacer material 106 to the hardmask material. In one embodiment, the etching process is a dry etching process. In this embodiment, a nitride or oxide containing film is etched with a fluorine containing plasma generated from one or more of the following precursors: $CF_4$, $CHF_3$, $CH_2F_2$, $CH_3F$, $C_4F_6$, or $C_4F_8$. A source power utilized to generate the plasma is between about 300 W and about 1500 W, a bias power utilized to bias the plasma is between about 50 W and about 700 W, a pressure of a process environment for performing the etching process is maintained between about 5 mTorr and about 20 mTorr, and a temperature of the substrate 102 during the etching process is maintained between about 10° C. and about 80° C. After etching of the hardmask material 104, regions 114 of the substrate 102 are exposed between adjacent portions of the hardmask material 104.

A pitch 108 of the patterned hardmask 106 is less than about 40 nm, such as about 30 nm or less. In this embodiment, a width 110 of certain hardmask material portions is about 20 nm or less, such as about 15 nm or less. Similarly, a width 112 of the exposed regions 114 is about 20 nm or less, such as about 15 nm or less.

Figure 2:
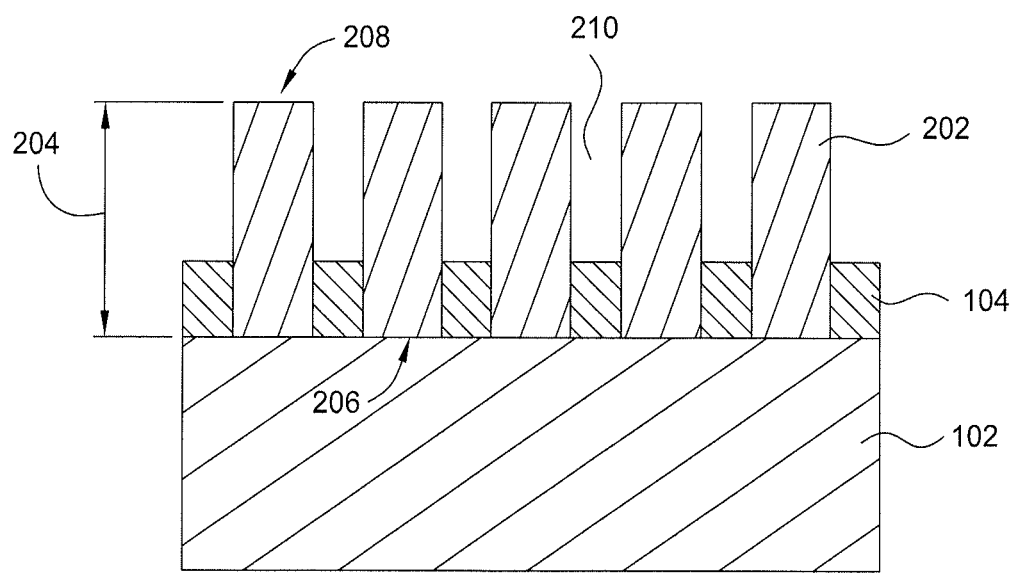
FIG. 2 illustrates a partial cross-sectional view of the substrate of FIG. 1 with the spacer material removed and first mandrel structures formed on the substrate according to an embodiment described herein.

At operation 820, first mandrel structures 202 are formed on a substrate patterned by the hardmask material 104. FIG. 2 illustrates a partial cross-sectional view of the substrate of FIG. 1 with the spacer material 106 removed and first mandrel structures 202 formed on the substrate 102 according to an embodiment described herein. The spacer material 106 is removed by suitable selective etching processes, such as wet etching or drying etching processes.

In embodiments where the spacer material 106 is a silicon oxide material, a plasma is generated from one or more of the following precursors: $C_4F_6$, $O_2$, Ar, and He. In this embodiment, a source power utilized to generate the plasma is between about 300 W and about 900 W, a bias power utilized to bias the plasma is between about 300 W and about 700 W, and a pressure of a process environment for performing the etching process is maintained between about 5 mTorr and about 15 mTorr. In embodiments where the spacer material 106 is a silicon nitride material, a plasma is generated from one or more of the following precursors: $CH_3F$, $CH_4$, $O_2$, $H_2$, $N_2$, and He. In this embodiment, a source power utilized to generate the plasma is between about 400 W and about 800 W and a bias power utilized to bias the plasma is between about 30 W and about 100 W. In other embodiments where the spacer material 106 is a silicon oxide material, a dilute HF wet etching process is utilized.

In one embodiment, suitable apparatus for performing the etching process is the CENTRIS™ SYM3™ etching apparatus available from Applied Materials, Inc., Santa Clara, Calif. It is contemplated that other suitably configured apparatus from other manufacturers may also be utilized in accordance with the embodiments described herein. The spacer removal process removes the spacer material 106 selectively to the hardmask material 104 and the substrate 102, leaving the hardmask material 104 on the substrate 102.

The first mandrel structures 202 are formed in the exposed regions 114 depicted in FIG. 1. The first mandrel structures 202 are deposited on a surface 206 of the substrate and the first mandrel structures 202 grown from the surface 206 of the substrate 102. In one embodiment, a suitable apparatus for performing the first mandrel structure deposition is the CENTURA® RP EPI apparatus available from Applied Materials, Inc., Santa Clara, Calif. It is contemplated that other suitably configured apparatus from other manufacturers may also be utilized in accordance with the embodiments described herein. Each of the first mandrel structures 202 are separated from adjacent first mandrel structures 202 by the patterned hardmask material 104 and spacers 210. The first mandrel structures 202 are grown such that a top surface 208 of the first mandrel structures 202 is a distance 204 of greater than about 80 nm above the surface 206 of the substrate 102. In one embodiment, the distance 204 is between about 100 nm and about 200 nm.

In one embodiment, the first mandrel structures 202 are formed on the substrate 102 by an epitaxial deposition process. In one embodiment, a gallium containing precursor and an arsenic containing precursor are pulsed in an alternating matter to deposit the first mandrel structures 202. In this embodiment, the gallium containing precursor is trimethylgallium and the arsenic containing precursor is $AsH_3$. In this embodiment, the first mandrel structures 202 are fabricated in an environment maintained at a pressure of between about 1 Torr and about 10 Torr and a temperature of between about 450° C. and about 800° C. The epitaxial deposition process utilizes a layer-by-layer deposition technique which is believed to maintain the substantially vertical orientation of the first mandrel structures 202 as the first mandrel structures 202 continue to grow from the surface 206 and above the hardmask material 104.

In one embodiment, the first mandrel structures 202 are formed from a III-V material. For example, the first mandrel structures 202 are formed from one or more of aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum phosphide, boron arsenide, boron nitride, boron phosphide, gallium antimonide, gallium arsenide, gallium arsenide phosphide, gallium phosphide, indium antimonide, indium arsenide, indium gallium arsenide, indium gallium nitride, indium gallium phosphide, indium nitride, and indium phosphide, among others.

Figure 3:
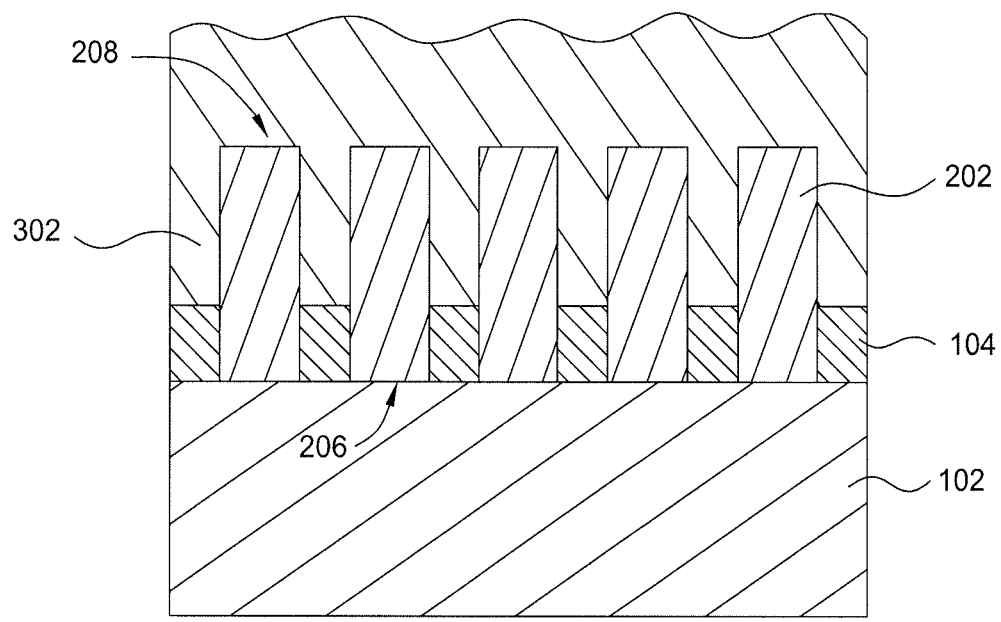
FIG. 3 illustrates a partial cross-sectional view of the substrate of FIG. 2 with a gap fill material formed on the substrate over the hardmask material and the first mandrel structures according to an embodiment described herein.

At operation 830, the gap fill material 302 is deposited on the substrate 102 over the hardmask material 104 and the first mandrel structures 202. FIG. 3 illustrates a partial cross-sectional view of the substrate 102 of FIG. 2 with a gap fill material 302 formed on the substrate 102 over the hardmask material 104 and the first mandrel structures 202 according to an embodiment described herein. The gap fill material 302 is deposited such that the gap fill material fills the voids 210 and is deposited to a thickness beyond the top surface 208 of the first mandrel structures 202. In one embodiment, a suitable apparatus for performing the gap fill deposition process is the PRODUCER® ETERNA™ FCVD™ apparatus available from Applied Materials, Inc., Santa Clara, Calif. It is contemplated that suitably configured apparatus from other manufacturers may also be utilized in accordance with the embodiments described herein.

In one embodiment, the gap fill material is a flowable material. The flowable material has characteristics of a solid material but also has the ability to "flow," thus enabling substantially void-free bottom up material deposition. In one embodiment, the gap fill material 302 is deposited by a flowable chemical vapor deposition (CVD) process. In one example, a CVD process is utilized to deposit a flowable silicon oxide containing gap fill material 302. In this embodiment, a silicon oxide material is sequentially deposited, cured, and annealed. In another example, a CVD process is utilized to deposit a silicon nitride gap fill material 302. In this embodiment, a silicon nitride material is sequentially deposited and subjected to a nitridation plasma treatment. In another embodiment, the gap fill material 302 is formed by a spin on glass (SOG) process. In this embodiment, the gap fill material 302 is an oxide containing material, such as silicon dioxide or the like.

Figure 4:
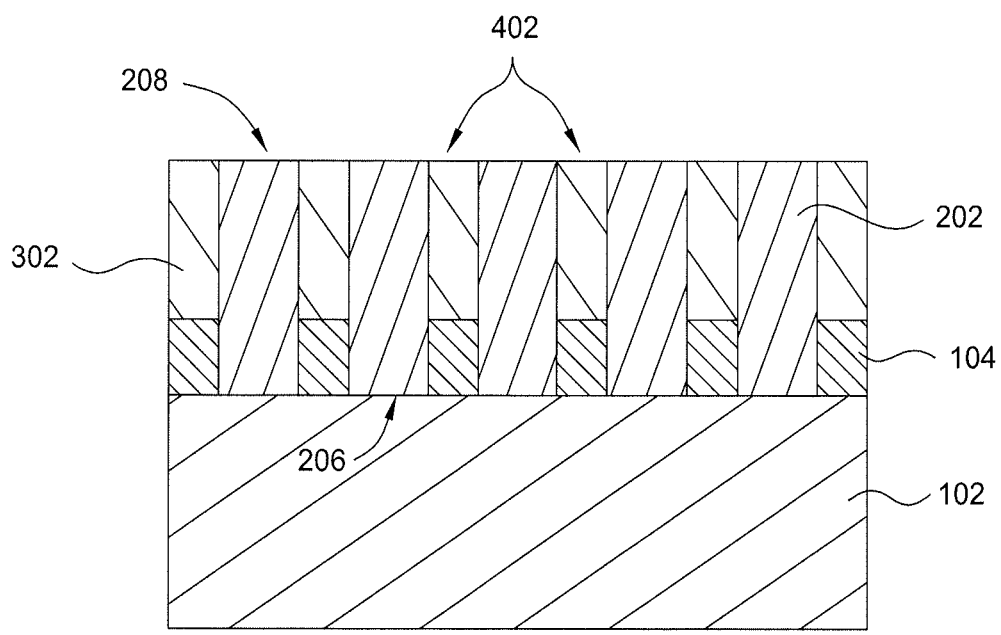
FIG. 4 illustrates a partial cross-sectional view of the substrate of FIG. 3 after planarization of the gap fill material according to an embodiment described herein.

At operation 840, the gap fill material is planarized. FIG. 4 illustrates a partial cross-sectional view of the substrate 102 of FIG. 3 after planarization of the gap fill material 302 according to an embodiment described herein. In one embodiment, planarization of the gap fill material 302 is performed by a chemical mechanical polishing process. In another embodiment, planarization of the gap fill material 302 is performed by an etching process.

The gap fill material 302 is removed to a point where a top surface 402 of the gap fill material 302 is substantially planar with the top surface 208 of the first mandrel structures 202. In one embodiment, it is contemplated that the first mandrel structures 202 are utilized as a removal point. In another embodiment, the gap fill material 302 is subjected to a time based etching process to planarize the surfaces 402, 208.

Figure 5:
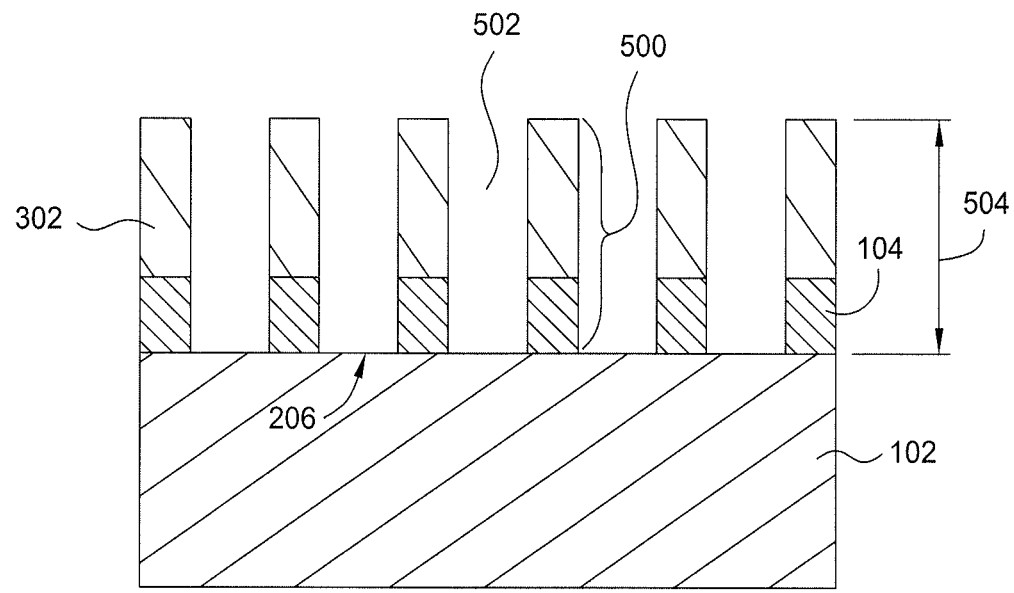
FIG. 5 illustrates a partial cross-sectional view of the substrate of FIG. 4 with the first mandrel structures removed to form second mandrel structures according to an embodiment described herein.

At operation 850, the first mandrel structures 202 are removed to form the second mandrel structures 500 which include the hardmask material 104 and the gap fill material 302. FIG. 5 illustrates a partial cross-sectional view of the substrate 102 of FIG. 4 with the first mandrel structures 202 removed to form second mandrel structures 500 according to an embodiment described herein. A selective etching process is utilized to remove the first mandrel structures 202. For example, etch chemistries selective to III-V materials are utilized to remove the first mandrel structures 202 selectively to the oxide and/or nitride containing gap fill material 302 and hardmask material 104.

In one embodiment, a chlorine containing precursor, such as HCl, is delivered to a process environment with a hydrogen containing precursor, such as $H_2$. The precursors are delivered to the process environment with an inert carrier gas such as $N_2$ or Ar. In one example, the HCl is delivered to the process environment at a flow rate of between about 1 sccm and about 500 sccm. A temperature of the process environment is maintained between about 300° C. and about 700° C. and a pressure of the process environment is maintained between about 0 Torr and about 100 Torr.

Removal of the first mandrel structures 202 results in spaces 502 formed between adjacent second mandrel structures 500. The spaces 502 also expose a second region of the top surface 206 of the substrate 102. A height of the second mandrel structures 500 is similar to the distance 204, for example, substantially equal to the distance 204.

Figure 6:
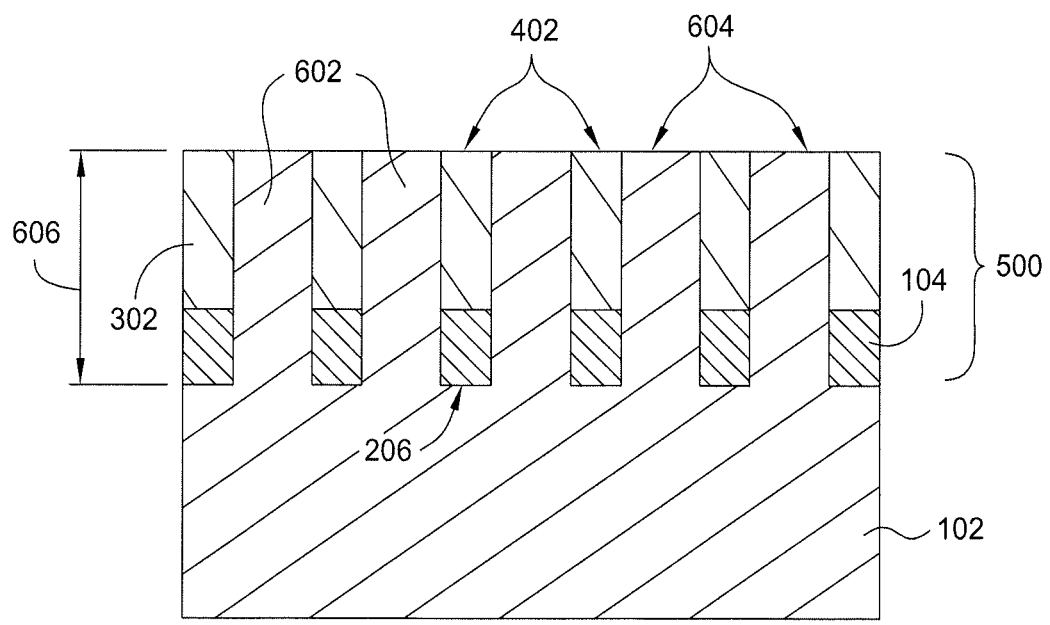
FIG. 6 illustrates a partial cross-sectional view of the substrate of FIG. 5 after forming fin structures on the substrate according to an embodiment described herein.

At operation 860, the fin structures 602 are deposited on the substrate 102 using the second mandrel structures 500 as a mask. FIG. 6 illustrates a partial cross-sectional view of the substrate 102 of FIG. 5 after forming fin structures 602 on the substrate 102 according to an embodiment described herein. The fin structures 602 extend a second distance 606 of greater than about 80 nm, such as between about 100 nm and about 200 nm, above the surface 206. In one embodiment, the fin structures 602 are formed by an epitaxial deposition process. In this embodiment, the material utilized to form the fin structures 602 are the same as the material utilized to form the substrate 102. In other embodiments, the materials utilized to form the fin structures include silicon containing materials, germanium containing materials, silicon germanium containing material, and III-V materials, among others. For example, a dichlorosilane precursor and a $GeH_4$ precursor are activated and pulsed in an alternating manner to deposit a silicon germanium material as the fin structures 602.

The fin structures 602 extend the second distance 606 such that a top surface 604 of the fin structures 602 are substantially co-planar with the top surface 402 of the gap fill material 302. By utilizing the second mandrel structures 500 as a mask or mold/confinement structure, it is believed that the fin structures 602 exhibit an improved verticality profile due to the improved verticality of the hardmask material 104 and the gap fill material 302 of the second mandrel structures 500. The second mandrel structures 500 are also believed to reduce lateral growth of the fin structures 602 during formation and may also reduce undesirable facet formation within the fin structures 602.

Figure 7:
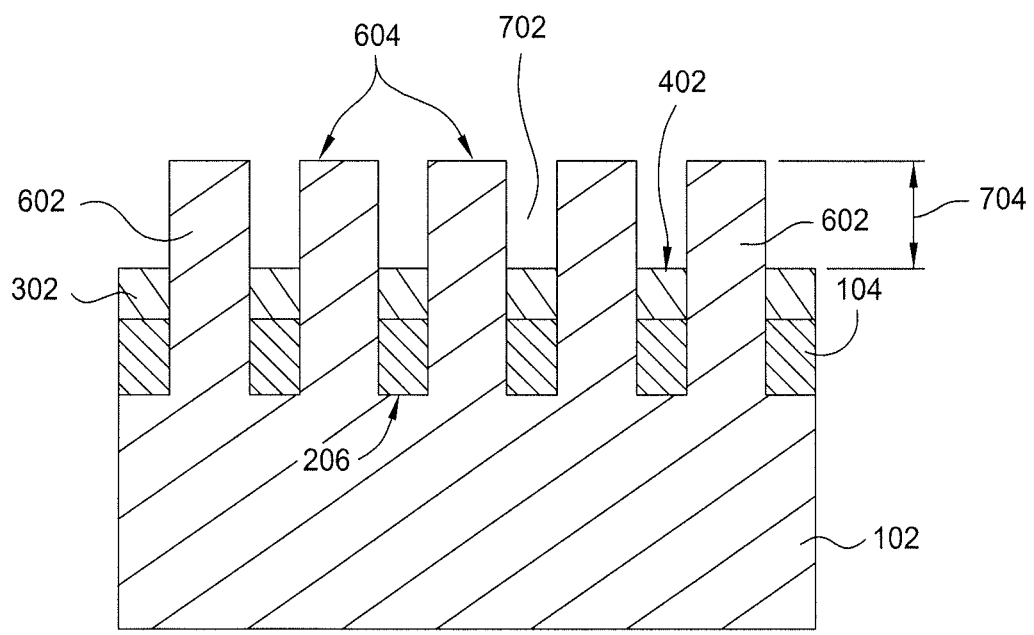
FIG. 7 illustrates a partial cross-sectional view of the substrate of FIG. 6 after etching the gap fill material according to an embodiment described herein.

At operation 870, the gap fill material 302 of the second mandrel structures 500 is etched to expose the fin structures 602. FIG. 7 illustrates a partial cross-sectional view of the substrate 102 of FIG. 6 after etching the gap fill material 302 according to an embodiment described herein. In one embodiment, the top surface 402 of the gap fill material 302 is recessed from the top surface 604 of the fin structures a third distance 704 of greater than about 80 nm, such as between about 100 nm and about 200 nm. The gap fill material 302 is etched by a selective etching process that preferentially etches to the oxide or nitride materials of the gap fill material 302. In one embodiment, a SICONI® process, available from Applied Materials, Inc., Santa Clara, Calif., is utilized to etch the gap fill material 302.

After recessing the gap fill material 302 to expose the fin structures 602, subsequent semiconductor processing operations may be performed. It is contemplated that the remaining portion of second mandrel structures 500 may remain disposed on the substrate 102 to provide for fin isolation or may be removed, depending upon the desired device implementation.

In summation, improved mask formation and etching process flows provide for bottom up fin formation for the fabrication of advanced semiconductor devices. By reducing spacer material height and by increasing the mask height (i.e. first and second mandrel structures), improved etching verticality may be achieved. It is also believed that by utilizing the process flows described herein, sidewall verticality of the masks (first and second mandrel structures) may be improved, which results in desirable etching verticality characteristics. Accordingly, sidewall (lateral growth) is more effectively controlled and edge roughness is also reduced.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   epitaxially depositing first mandrel structures on exposed first regions of a substrate;
   depositing a gap fill material over the first mandrel structures;
   removing the first mandrel structures to expose second regions of the substrate and form second mandrel structures comprising the gap fill material; and
   forming fin structures on the second regions of the substrate.

2. The method of claim 1, wherein the first mandrel structures are formed in an environment maintained at a pressure of between about 1 Torr and about 10 Torr.

3. The method of claim 1, wherein the first mandrel structure are formed at a temperature of between about 450° C. and about 800° C.

4. The method of claim 1, further comprising:
   etching the gap fill material after forming the fin structures.

5. The method of claim 1, wherein the forming the fin structures comprises epitaxially depositing on the second regions of the substrate a material selected from the group consisting of silicon containing material, germanium containing material, silicon germanium containing materials, and III-V materials.

6. The method of claim 1, further comprising:
   performing a chemical mechanical polishing process to planarize the gap fill material prior to removing the first mandrel structures.

7. The method of claim 1, further comprising:
   performing an etching process to planarize the gap fill material prior to removing the first mandrel structures.

8. The method of claim 1, wherein the first mandrel structures comprise a III-V material.

9. The method of claim 1, wherein depositing the gap fill material comprises performing a chemical vapor deposition process.

10. The method of claim 9, wherein performing the chemical vapor deposition process comprises depositing a flowable silicon oxide material or a flowable silicon nitride material.

11. The method of claim 10, wherein the depositing a flowable silicon oxide material comprises:
    curing the flowable silicon oxide material; and
    annealing the flowable silicon oxide material.

12. The method of claim 10, wherein the depositing a flowable silicon nitride material comprises exposing the flowable silicon nitride material to a nitridation plasma treatment.

13. The method of claim 1, wherein depositing the gap fill material comprises depositing an oxide containing material deposited by a spin on glass process.

14. The method of claim 1, further comprising:
    depositing a hardmask material on the substrate; and
    depositing a spacer material on the hardmask material.

15. A substrate processing method, comprising:
    forming first mandrel structures on exposed regions of a substrate;
    depositing a gap fill material over the first mandrel structures;
    removing the first mandrel structures to expose second regions of the substrate and form second mandrel structures comprising the gap fill material;
    forming fin structures on the second regions using the second mandrel structures as a mask; and
    recessing the gap fill material below a top surface of the fin structures.

16. The method of claim 15, wherein the fin structures are formed by an epitaxial deposition process.

17. The method of claim 15, wherein the fin structures are formed from a material selected from the group consisting of silicon containing material, germanium containing material, silicon germanium containing materials, and III-V materials.

18. The method of claim 15, wherein the first mandrel structures are formed at a pressure of between about 1 Torr and about 10 Torr and a temperature of between about 450° C. and about 800° C.

19. A substrate processing method, comprising:
    forming a patterned hardmask material on a substrate;
    forming first mandrel structures on exposed regions of the substrate, wherein the first mandrel structures extend above a top surface of the substrate;
    depositing a gap fill material over the hardmask material and the first mandrel structures;
    removing the first mandrel structures to expose second regions of the substrate and form second mandrel structures comprising the hardmask material and the flowable gap fill material, wherein the second mandrel structures extend a second distance above the top surface of the substrate;

depositing fin structures on the second regions of the substrate; and planarizing the fin structures after forming the fin structures.

\* \* \* \* \*

UNITED STATES PATENT AND TRADEMARK OFFICE
CERTIFICATE OF CORRECTION

PATENT NO. : 10,741,393 B2  
APPLICATION NO. : 16/259585  
DATED : August 11, 2020  
INVENTOR(S) : Yung-chen Lin et al.

Page 1 of 1

It is certified that error appears in the above-identified patent and that said Letters Patent is hereby corrected as shown below:

In the Claims

In Column 9, Line 1, in Claim 19, before "gap" delete "flowable".

Signed and Sealed this
Twentieth Day of October, 2020

Andrei Iancu
*Director of the United States Patent and Trademark Office*